United States Patent [19]

Nonogaki et al.

[11] Patent Number: 4,537,851
[45] Date of Patent: Aug. 27, 1985

[54] PROCESS OF FORMING POWDER PATTERN USING POSITIVE DIAZONIUM SALT PHOTORESIST

[75] Inventors: Saburo Nonogaki, Tokyo; Nobuaki Hayashi, Hachioji; Yoshifumi Tomita, Mobara, all of Japan

[73] Assignee: Hitachi, Ltd., Tokyo, Japan

[21] Appl. No.: 531,266

[22] Filed: Sep. 12, 1983

Related U.S. Application Data

[63] Continuation of Ser. No. 313,170, Nov. 20, 1981, abandoned.

[30] Foreign Application Priority Data

Oct. 22, 1980 [JP] Japan ................. 55-146941

[51] Int. Cl.³ ............... G03C 5/34; G03C 5/18; G03F 7/08; G03F 7/26
[52] U.S. Cl. ..................... 430/144; 430/23; 430/25; 430/28; 430/29; 430/145; 430/149; 430/150; 430/176; 430/180; 430/181; 430/326
[58] Field of Search ............ 430/176, 181, 180, 144, 430/326, 28, 149, 150, 143, 145, 23, 25, 29

[56] References Cited

U.S. PATENT DOCUMENTS

| 2,597,412 | 5/1952 | Von Glahn et al. | 430/181 |
| 2,837,429 | 6/1958 | Whiting | 430/28 |
| 3,373,021 | 3/1968 | Adams et al. | 430/180 |
| 3,585,034 | 6/1971 | Levinos | 430/28 |
| 3,694,203 | 9/1972 | Okubo et al. | 430/144 |
| 3,778,270 | 12/1973 | Roos | 430/326 |
| 3,929,488 | 12/1975 | Smith | 430/326 |
| 4,149,888 | 4/1979 | Loprest | 430/176 |
| 4,210,711 | 7/1980 | Kitajima et al. | 430/326 |
| 4,273,842 | 6/1981 | Nonogaki et al. | 430/28 |
| 4,296,193 | 10/1981 | Moriya et al. | 430/326 |
| 4,374,193 | 2/1983 | Moriya et al. | 430/145 |

FOREIGN PATENT DOCUMENTS

| 56-101141 | 8/1981 | Japan | 430/145 |
| 56-119130 | 9/1981 | Japan | 430/145 |
| 1103865 | 2/1968 | United Kingdom | 430/144 |
| 1105112 | 3/1968 | United Kingdom | 430/144 |

Primary Examiner—Charles L. Bowers, Jr.
Attorney, Agent, or Firm—Antonelli, Terry & Wands

[57] ABSTRACT

A water-soluble, positive-working photoresist composition is disclosed which comprises water-soluble aromatic diazonium salt, water-soluble phenolic compound, and water-soluble polymeric compound. When the film of this composition is irradiated with a pattern of actinic ray and then brought into contact with an alkaline gas or solution, the coating of unexposed areas hardens to become water-insoluble. Preferably, when the film is brought into contact with a suspension of powder or dry powder after being hardened, a positive pattern of powder is obtained by the development with water.

44 Claims, 4 Drawing Figures

PROCESS OF FORMING POWDER PATTERN USING POSITIVE DIAZONIUM SALT PHOTORESIST

This is a continuation of application Ser. No. 313,170, filed Oct. 20, 1981, abandoned.

BACKGROUND OF THE INVENTION

The present invention relates to a photoresist composition and a pattern forming process utilizing it. More particularly, the invention relates to a photoresist composition applicable for the reproduction of optical image and for lithography and to a pattern forming process utilizing it.

DESCRIPTION OF THE PRIOR ART

No positive-working photoresist composition which is water-soluble has so far been found out. Organic solvent-soluble ones have been known, but they have difficulties with respect to handling, such as fire and health hazards due to the solvent when industrially using them in large amounts.

For instance, in the formation of a black matrix on the inner surface of the face plate of a color picture tube, it would be accomplished in a simple way if a photoresist composition which is positive-working and water-soluble, was used; nevertheless, it is performed in a complicated way like the following since such a water-soluble photoresist composition has not existed.

That is, the black matrix is formed through the steps: coating of aqueous solution of a water-soluble, negative-working photoresist composition, such as dichromated polyvinyl alcohol, on the inner surface of the face plate of a color picture tube, drying, exposure, development, drying, further coating of a carbon suspension, drying, stripping of the photoresist coating, and drying. In addition to the complexity of operations, another problem of this process is that a large volume of water is necessary for the development and stripping of the photoresist composition.

SUMMARY OF THE INVENTION

An object of this invention is to provide a novel water-soluble, positive-working photoresist composition and a process of forming positive patterns by using it.

Another object of the invention is to provide a simple process for producing black matrices of color picture tubes.

These and other objects of the invention can be achieved with a photoresist composition containing water-soluble aromatic diazonium salt, water-soluble phenolic compound, and water-soluble polymeric compound and with a pattern forming process utilizing said photoresist composition.

DETAILED DESCRIPTION OF PREFERRED EMBODIMENTS

Figure 1:
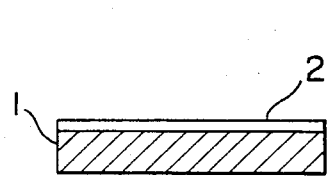
FIGS. 1, 2, 3 and 4 are the drawings for illustrating this invention.

In the photoresist composition of this invention, the preferred content of the phenolic compound ranges from 0.1 to 1.5 mole per mole of the aromatic diazonium salt. The preferred content of the polymeric compound is in the range of 0.5 to 6, in particular 1 to 3, in weight ratio to the total content of the phenolic compound and diazonium salt.

The water-soluble aromatic diazonium salts adapted for this invention include 4-(dimethylamino)benzenediazonium chloride.zinc chloride, 4-(diethylamino)benzenediazonium chloride.zinc chloride, 4-(N-ethyl-N-hydroxyethylamino)benzenediazonium chloride.zinc chloride, 4-(dimethylamino)-3-methoxybenzenediazonium chloride.zinc chloride, 4-methoxybenzenediazonium chloride.zinc chloride, 4-(phenylamino)benzenediazonium hydrogensulfate, 4-(dimethylamino)benzenediazonium tetrafluoroborate, and 4-(diethylamino)benzenediazonium tetrafluoroborate.

Among these, the firstly, secondly, thirdly, and sixthly cited diazonium salts are particularly favorable. These diazonium salts can be used also in combination.

The suited water-soluble phenols in this invention include polyhydric phenols such as hydroquinone, catechol, resorcin, pyrogallol, and gallic acid; derivatives of these phenols; and further sodium 2-naphthol-4-sulfonate and disodium 2-naphthol-4,5-disulfonate.

Among them, particularly preferred are polyhydric phenols and derivatives thereof, e.g., hydroquinone, catechol, resorcin, and pyrogallol. These phenols also may be used in combination.

The suited water-soluble polymeric compounds in this invention include polyvinylpyrrolidone, acrylamide-diacetoneacrylamide copolymer, hydroxypropylmethylcellulose, polyacrylamide, polyvinyl alcohol, gelatin, polyethylene oxide, and further water-soluble derivatives thereof and copolymers made of monomer units of these polymers. Examples of said water-soluble derivatives include partial acetals of polyvinyl alcohol.

Among these polymeric compounds, particularly preferred are polyvinylpyrrolidone, acrylamide-diacetoneacrylamide copolymer, and hydroxypropylmethylcellulose. These polymeric compounds also may be used in combination.

The photoresist composition comprising the components described above is coated on a substrate, exposed to a pattern of actinic ray such as ultraviolet light, brought into contact with alkaline gas such as ammonia vapor or with alkaline solution, and then washed with water, whereby the unexposed areas of the coating become water-insoluble or sparingly water-soluble and remain on the substrate, and in contrast the exposed areas of the coating are almost perfectly removed from the substrate, thus a pattern being formed on the substrate.

In order to form a pattern of fluorescent material or the like, a slurry is prepared by adding a substantially light transmittable powder to an aqueous solution of the photoresist composition of this invention, as in the case of usual photoresist compositions, and the treatment therewith may be carried out as stated above.

Moreover, in order to form a pattern of powder material in the process of this invention, the following process or the like is applicable: the exposed coating, after treated with an alkaline gas or solution, is brought into contact with the powder material, giving a pattern with the powder adhering to the unexposed areas. Accordingly, it is possible by using carbon as the powder to form a black matrix on the inner surface of the face plate of a color picture tube.

A substantially dry powder may be applied onto the photoresist coating by spraying as it is or a suspension of powder may be applied thereto. In general, the application as a suspension is preferred in that higher density coating is obtained.

As the alkaline gas or solution, those of gaseous form such as ammonia gas and gaseous organic amines are preferred. When an alkaline solution, for example aqueous ammonia, is used, the coating begins to dissolve before a reaction which makes the coating water-insoluble proceeds sufficiently, if the solution is too dilute; on the contrary, if the solution is too much concentrated, the reaction proceeds not uniformly. Accordingly, much attention must be paid to the reaction control, this being the reason for the preference of gaseous alkaline substance. When an aqueous alkali is used, the pH is preferably 11.5–13.5, particularly 12–13. If the pH is below about 11, the coating begins to dissolve before the reaction proceeds sufficiently, as mentioned above, though the rate of the reaction somewhat varies with the kinds and combinations of phenols, diazonium salts, and polymeric compounds used. Therefore, in any case, the concentration of aqueous alkali needs to be adequate for individual photoresist compositions to react sufficiently before they dissolve.

The contact of powder with the coating is possible either before or after the washing step. When the contact step is after the washing step, however, part of the powder remains also in the exposed areas and hence must be removed. The removal is effected by further washing with water or by gas blowing. In some cases, minute amounts of powder remain in the exposed areas even though a removing operation is applied, thus giving a pattern having slight "fog". On the other hand, when the contact of powder is performed before the washing step or at the same time therewith, the powder adheres to the coating without direct adhesion to the substrate. In consequence, the powder adhering to the exposed areas is carried away along with the exposed coating dissolving during the washing step, thus giving a good pattern wherein the powder adheres only to the unexposed areas and almost no powder adheres to the exposed areas. Accordingly, the contact of powder to the coating is preferred to be carried out before or during the washing step.

The contact of powder to the coating can be carried out also afer the exposure step and before the contact of alkaline gas or solution to the coating. In this case, if a suspension of powder is used, the coating of unexposed areas also dissolves in the suspension medium, since said coating is yet water-soluble. The powder used therefore needs to be substantially dry in this case.

Furthermore, the contact of powder to the coating can be carried out also before the exposure step. In this case also, the powder used needs to be substantially dry by the same reason as the above. When a light-absorbing substance such as carbon is used as said powder, it is difficult in the exposure step to give a sufficient quantity of light to the coating if the powder coating is too thick. In consequence, the thickness of this power coating needs to be in such a range as to substantially transmit the light. On the other hand, when a substantially light-transmitting powder such as a transparent fluorescent material is used, its thickness need not be particularly restricted.

The cause of producing the difference of solubility of photoresist composition coating between the exposed and unexposed areas in the process of this invention is considered as follows: In the unexposed coating, the diazonium compound reacts with the phenolic compound by the alkali treatment, producing a water-insoluble or sparingly water-soluble compound. In contrast, in the exposed coating, such a reaction occurs only slightly or not at all because the content of diazonium compound decreases by the exposure to light.

Typical reactions of diazonium salts with phenols in an alkaline medium are a coupling reaction and an oxidation reaction, which are exemplified by the following:

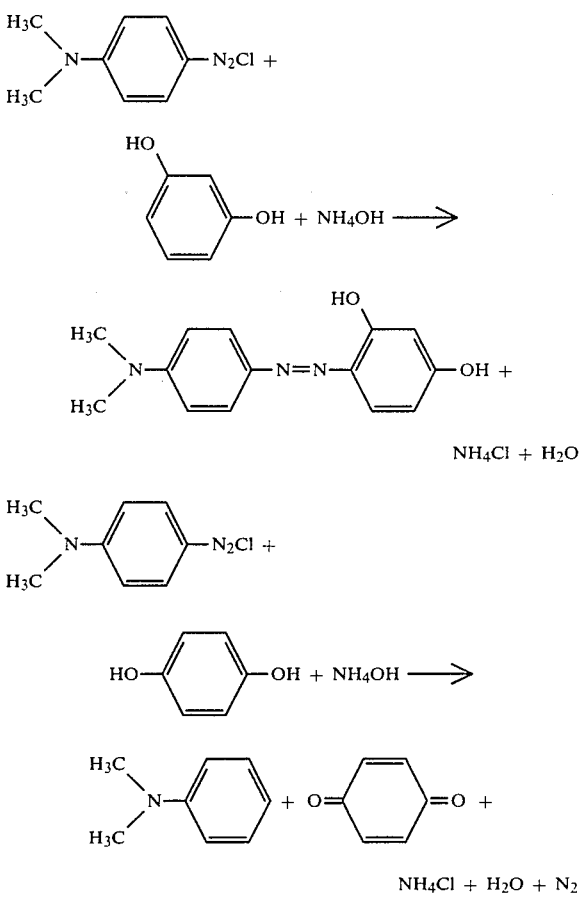

Of the above-mentioned phenols, resorcin and 2-naphthol derivatives undergo the coupling reaction almost exclusively, hydroquinone undergoes the oxidation reaction almost exclusively, and pyrogallol and gallic acid undergo both coupling reaction and oxidation reaction.

Both of the above reactions produce water-insoluble compounds. In this case, a polymeric compound, when coexisting, becomes entirely or partially water-insoluble. This insolubilization is probably due to the good compatibilty of the polymeric compound with said water-insoluble compound, a homogeneous, water-insoluble mixture of both the compounds being produced.

This invention will be illustrated in more detail by the following examples:

EXAMPLE 1

The following composition of aqueous solution was prepared: 4-(dimethylamino)benzenediazonium chloride.zinc chloride—0.356 g, hydroquinone—0.110 g, poly(N-vinylpyrrolidone)—0.5 g, and water—29 g.

Figure 2:
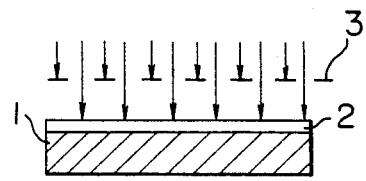
Figure 3:
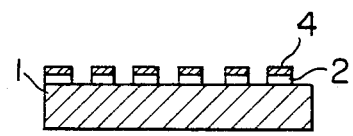

This solution was applied on a glass plate 1 (6 cm×6 cm) using a spin-coater at 400 rpm to form a coating film 2 after hot-air drying (FIG. 1). The film 2 was irradiated with the light of a 500 W ultra-high pressure mercury lamp through a shadow mask 3, at a distance of about 50 cm from the lamp for 40 seconds (FIG. 2). Then, the film was brought into contact with the vapor evolved from concentrated aqueous ammonia for about 5 seconds, and the plate was dipped in a suspension of carbon (registered trade name Hitasol, manufactured by Hitachi Powder Metallurgy Co., Ltd.), taken out immediately, and washed with water without drying. In this way, a black coating film 4 was prepared which comprises carbon powder adhering only to the unexposed areas of glass plate (FIG. 3).

EXAMPLE 2

The following composition of aqueous solution was prepared:

4-(dimethylamino)benzenediazonium chloride.zinc chloride—0.356 g, resorcin—0.110 g, poly(N-vinylpyrrolidone)—0.5 g, and water—29 g.

Figure 4:
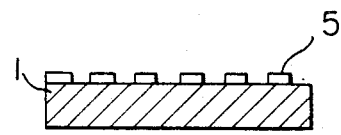

This solution was applied on a glass plate 1 (6 cm×6 cm) using a spin-coater at a rotating speed of 400 rpm to form coating film 2 after hot-air drying (FIG. 1). The film was then exposed to light and treated with ammonia, in the same manner as Example 1, and immediately thereafter was washed with water. In this way, film 5, tinged with red, remained and the exposed film was removed almost completely (FIG. 4).

EXAMPLE 3

The same composition of aqueous solution as in Example 2 was prepared, and a black coating film comprising carbon adhering only to the unexposed areas was formed in the same manner as Example 1 (FIG. 3).

EXAMPLE 4

The following composition of aqueous solution was prepared:

4-(dimethylamino)benzenediazonium chloride.zinc chloride—0.356 g, pyrogallol—0.126 g, poly(N-vinylpyrrolidone)—0.5 g, and water—29 g.

On operating in the same manner as Example 2, a dark red film 5 remained in the unexposed areas and the exposed film was eliminated (FIG. 4).

EXAMPLE 5

The following composition of aqueous solution was prepared:

4-(N-ethyl-N-hydroxyethylamino)benzenediazonium chloride.zinc chloride—0.332 g, hydroquinone—0.110 g, poly(N-vinylpyrrolidone)—0.5 g, and water—29 g.

In the same manner as Example 1 was formed a black coating film 4 comprising carbon adhering only to the exposed areas of glass plate (FIG. 3).

EXAMPLE 6

The following composition of aqueous solution was prepared:

4-(diethylamino)benzenediazonium chloride.zinc chloride—0.316 g, hydroquinone—0.110 g, poly(N-vinylpyrrolidone)—0.5 g, and water—29 g.

In the same manner as Example 1 was formed a black coating film 4 comprising carbon adhering only to the unexposed arears of glass plate (FIG. 3).

EXAMPLE 7

The following composition of aqueous solution was prepared:

4-(phenylamino)benzenediazonium chloride.hydrogen sulfate—0.300 g, hydroquinone—0.110 g, poly(N-vinylpyrrolidone)—0.5 g, and water—29 g.

In the same manner as Example 1 was formed a black coating film 4 comprising carbon adhering only to the unexposed areas of glass plate (FIG. 3).

EXAMPLES 8-13

Aqueous solutions each composed of 4-(dimethylamino)benzenediazonium chloride.zinc chloride (0.356 g), hydroquinone (0.110 g), water (59 g), and a polymeric compound as shown in Table 1 were prepared.

TABLE 1

| Example No. | Polymeric compound | Content (g) |
| --- | --- | --- |
| 8 | Acrylamide-diacetoneacrylamide copolymer (monomer ratio 1.67:1) | 0.35 |
| 9 | Acrylamide-diacetoneacrylamide copolymer (monomer ratio 2.2:1) | 0.35 |
| 10 | Hydroxypropyl-methylcellulose | 0.3 |
| 11* | Poly(N—vinylpyrrolidone) + Acrylamide-diacetoneacrylamide copolymer (monomer ratio 1.67:1) | 0.2  0.2 |
| 12* | Polyacrylamide + Polyacrylamide-diacetoneacrylamide copolymer (monomer ratio 1.67:1) | 0.1  0.1 |
| 13* | Poly(vinyl alcohol) + Polyacrylamide-diacetoneacrylamide copolymer (monomer ratio 1.67:1) | 0.2  0.1 |

*A mixture of two polymers is used.

Using these aqueous solutions, respective black coating films comprising carbon adhering only to the unexposed areas of glass plates were formed in the same manner as Example 1.

EXAMPLE 14

Using the same composition as in Example 1, coating, exposure, and contact with ammonia were carried out in the same manner as Example 1, and then a substantially dry carbon powder was sprayed onto the coating film, and the plate was washed with water and dried. In this case also, a black coating film was obtained which comprises carbon adhering only to the unexposed areas of glass plate.

EXAMPLE 15

The following composition of aqueous solution was prepared:

4-(N-ethyl-N-hydroxyethylamino)benzenediazonium chloride.zinc chloride—0.36 g, hydroquinone—0.11 g, poly(N-vinylpyrrolidone)—0.5 g, and water—29 g.

Coating of this solution on glass plate and exposure were carried out in the same manner as Example 1.

Then, the plate was dipped in an aqueous solution of sodium phosphate of pH 12 (2.5% concentration) for 5 seconds, successively dipped in the same suspension of carbon as used in Example 1, taken out in a minutes, and washed with water without drying. In this way, a black coating film was formed which comprises carbon adhering only to the unexposed areas of glass plate.

EXAMPLE 16

Coating of the same composition and exposure thereof were carried out in the same manner as Example 15. Then, the plate was dipped in an aqueous solution of sodium hydroxide of pH 13 (0.4% concentration) for 5 seconds. Thereafter, by carbon coating in the same manner as Example 15, a black coating film was formed which comprises carbon adhering only to the unexposed areas of glass plate.

EXAMPLE 17

The following composition of aqueous solution was prepared:
4-(N-ethyl-N-hydroxyethylamino)benzenediazonium chloride.zinc chloride—0.36 g, hydroquinone—0.11 g, acrylamide-diacetoneacrylamide copolymer (monomer ratio 1.67:1)—0.35 g, and water—59 g.

Using this solution, coating and exposure were carried out in the same manner as Example 15, and the plate was dipped in an aqueous solution of sodium phosphate of pH 12 (2.5% concentration) for 5 seconds. Thereafter, by carbon coating in the same manner as Example 15, a black coating film was formed which comprises carbon adhering only to the unexposed areas of glass plate.

EXAMPLE 18

Using an aqueous solution of sodium hydroxide of pH 13 in place of the alkaline aqueous solution of pH 12 used in Example 17, a black coating film was obtained which comprises carbon adhering only to the unexposed areas of glass plate.

COMPARATIVE EXAMPLES 1-3

In place of the alkaline aqueous solution of pH 12 used in Example 17, the following alkaline solutions were used, but no desired pattern was obtained in all cases:
1. Aqueous solution of sodium hydroxide of pH 14
2. Aqueous solution of sodium phosphate of pH 11
3. Aqueous solution of pH 10 containing 1.3% of sodium carbonate and 0.7% of sodium hydrogencarbonate

What is claimed is:

1. A process for forming a powder pattern using a positive-working photoresist, which comprises:
   (1) applying a water-soluble, positive-working photoresist composition comprising an admixture of water-soluble aromatic diazonium salt, water soluble phenolic compound, and water-soluble polymeric compound, on a substrate to form a positive-working photoresist film, said composition having sufficient concentration of water-soluble aromatic diazonium salt and phenolic compound, and polymeric compound, such that, upon later contact of the photoresist film with alkaline gas or solution, areas of the film can be rendered at most only sparingly water-soluble;
   (2) exposing the applied film to a prescribed pattern of actinic ray to decompose the diazonium salt in exposed areas;
   (3) contacting the resultant exposed film with an alkaline gas or solution to cause a reaction of the diazonium salt with the phenolic compound in unexposed areas to render the unexposed areas of the film at most only sparingly water-soluble, to form a treated film, said alkaline gas or solution having a sufficient concentration so as to make the unexposed area of the film sufficiently uniformly at most only sparingly water-soluble so as to dissolve only exposed areas of the film upon development;
   (4) developing the film, having been contacted with the alkaline gas or solution, with water to remove the film in exposed areas and form a positive-working resist image having a powder pattern; and
   (5) contacting a powder with the film to adhere thereto, the contacting with a powder being performed at any time after said applying a water-soluble, positive-working photoresist composition, up to being performed simultaneously with said developing;
   whereby fogging of the powder pattern on the substrate using a positive-working photoresist is avoided.

2. A process of forming a powder pattern using a positive-working photoresist, which comprises:
   (1) a first step of applying a water-soluble, positive-working photoresist composition comprising an admixture of water-soluble aromatic diazonium salt, water soluble phenolic compound, and water-soluble polymeric compound, on a substrate to form a positive-working photoresist film, said composition having sufficient concentration of water-soluble aromatic diazonium salt and phenolic compound, and polymeric compound, such that, upon later contact of the photoresist film with alkaline gas or solution, areas of the film can be rendered at most only sparingly water-soluble;
   (2) a second step of exposing said film to a prescribed pattern of actinic ray to decompose the diazonium salt in exposed areas;
   (3) a third step of contacting a substantially dry powder with the film to adhere thereto;
   (4) a fourth step of contacting the resultant exposed film with an alkaline gas or solution to cause a reaction of the diazonium salt with the phenolic compound in unexposed areas to render the unexposed areas of the film at most only sparingly water-soluble, to form a treated film, said alkaline gas or solution having a sufficient concentration so as to make the unexposed areas of the film sufficiently uniformly at most only sparingly water-soluble so as to dissolve only exposed areas of the film upon development, wherein said third step is performed after the second step of exposing the film but prior to said fourth step of contacting the resultant exposed film with an alkaline gas or solution;
   (5) a fifth step of developing the treated film with water to remove the film in exposed areas and form a positive-working resist image having a powder pattern,
   whereby fogging of the powder pattern on the substrate using a positive-working photoresist is avoided.

3. A pattern forming process of claim 2, wherein said water-soluble phenolic compound is at least one member selected from the group consisting of polyhydric phenols, derivatives thereof, and naphthol derivatives.

4. A pattern forming process of claim 2, wherein said water-soluble phenolic compound is at least one member selected from the group consisting of hydroquinone, catechol, resorcin, pyrogallol, gallic acid, 2-naphthol-4- solfonic acid salts, and 2-naphthol-4,5-disulfonic acid salts.

5. A pattern forming process of claim 2, wherein said water-soluble polymeric compound is at least one member selected from the group consisting of polyvinylpyrrolidone, acrylamide-diacetoneacrylamide copolymer, hydroxypropyl-methylcellulose, polyacrylamide, polyvinyl alcohol, gelatin, polyethylene oxide, their water-soluble derivatives, and copolymers made of their monomer units.

6. A pattern forming process of any of claim 2–4, wherein the content of said water-soluble phenolic compound ranges from 0.1 to 1.5 moles per mole of said water-soluble aromatic diazonium salt.

7. A pattern forming process of claim 2 or 5, wherein the content of said water-soluble polymeric compound is in the range of 0.5 to 6 in weight ratio to the total content of said water-soluble phenol compound and aromatic diazonium salt.

8. A pattern forming process of claim 2, wherein said step (4) is operated by contacting the film with an alkaline gas.

9. A pattern forming process of claim 8, wherein said alkaline gas is gaseous ammonia.

10. A pattern forming process of claim 8, wherein said alkaline gas is a gaseous organic amine.

11. A pattern forming process of claim 2, wherein, in said fourth step, said reaction of the diazonium salt with the phenolic compound renders the unexposed areas of the film water-insoluble.

12. A pattern forming process of claim 2, wherein said reaction is either one or both of a coupling reaction and an oxidation reaction.

13. A pattern forming process of claim 2, wherein said step (4) is operated by contacting with an alkaline aqueous solution, said alkaline aqueous solution having such an adequate concentration so as to make the unexposed areas of the film sufficiently water-insoluble before dissolving said unexposed areas of the film.

14. A pattern forming process of claim 13, wherein said alkaline aqueous solution has a pH value of 11.5 to 13.5.

15. A pattern forming process of claim 13, wherein said unexposed areas are made sufficiently water-insoluble by the progress of either one or both of said coupling reaction and oxidation reaction of the diazonium salt with the phenolic compound.

16. A pattern forming process of claim 2, wherein said water-soluble phenolic compound is hydroquinone.

17. A process of forming a powder pattern using a positive-working photoresist, which comprises:
(1) a first step of applying a water-soluble, positive-working photoresist composition comprising an admixture of water-soluble aromatic diazonium salt, water-soluble phenolic compound, and water-soluble polymeric compound, on a substrate to form a positive-working photoresist film, said composition having sufficient concentration of water-soluble aromatic diazonium salt and phenolic compound, and polymeric compound, such that, upon later contact of the photoresist film with alkaline gas or solution, areas of the film can be rendered at most only sparingly water-soluble;
(2) a second step of contacting a substantially dry powder with the film to adhere thereto a layer of dry powder having such a thickness that light is transmitted therethrough in the following, third, step;
(3) a third step of exposing the film to a prescribed pattern of actinic ray to decompose the diazonium salt in exposed areas;
(4) a fourth step of contacting the resultant exposed film with an alkaline gas or solution to cause a reaction of the diazonium salt with the phenolic compound in unexposed areas to render the unexposed areas of the film at most only sparingly water-soluble, to form a treated film, said alkaline gas or solution having a sufficient concentration so as to make the unexposed areas of the film sufficiently uniformly at most only sparingly water-soluble so as to dissolve only exposed areas of the film upon development; and
(5) a fifth step of developing the treated film with water to remove the film in exposed areas and form a positive-working resist image having a powder pattern,
whereby fogging of the powder pattern on the substrate using a positive-working photoresist is avoided.

18. A pattern forming process of claim 17, wherein said water-soluble phenolic compound is at least one member selected from the group consisting of polyhydric phenols, derivatives thereof, and naphthol derivatives.

19. A pattern forming process of claim 17, wherein said water-soluble polymer compound is at least one member selected from the group consisting of polyvinylpyrrolidone, acrylamide-diacetoneacrylamide copolymer, hydroxypropylmethylcellulose, polyacrylamide, polyvinyl alcohol, gelatin, polyethylene oxide, their water-soluble derivatives, and copolymers made of their monomer units.

20. A pattern forming process of claim 19, wherein the content of said water-soluble polymer compound is in the range of 0.5 to 6 in weight ratio to the total content of said water-soluble phenol compound and aromatic diazonium salt.

21. A pattern forming process of claim 17, wherein the content of said water-soluble phenolic compound ranges from 0.1 to 1.5 moles per mole of said water-soluble aromatic diazonium salt.

22. A pattern forming process of claim 17, wherein the content of said water-soluble polymer compound is in the range of 0.5 to 6 in weight ratio to the total content of said water-soluble phenol compound and aromatic diazonium salt.

23. A pattern forming process of claim 17, wherein said step (4) is operated by contacting the film with an alkaline gas.

24. A pattern forming process of claim 23, wherein said alkaline gas is gaseous ammonia.

25. A pattern forming process of claim 23, wherein said alkaline gas is a gaseous organic amine.

26. A pattern forming process of claim 25, wherein said powder, when brought into contact with the film is in the state of suspension.

27. A pattern forming process of claim 25, wherein said powder, when brought into contact with the film is in a substantially dry state.

28. A pattern forming process of claim 17, wherein said water-soluble phenolic compound is hydroquinone.

29. A process for forming a powder pattern using a positive-working photoresist, which comprises:
(1) a first step of applying a water-soluble, positive-working photoresist composition comprising an admixture of water-soluble aromatic diazomium salt, water-soluble phenolic compound and water-soluble polymeric compound, on a substrate to form a positive-working photoresist film, said film composition having sufficient concentration of water-soluble aromatic diazonium salt and phenolic compound, and polymeric compound, such that, upon later contact of the photoresist film with alkaline gas or solution, areas of the film can be rendered at most only sparingly water-soluble;

(2) a second step of exposing said film to a prescribed pattern of actinic ray to decompose the diazonium salt in exposed areas;

(3) a third step of contacting the resulting exposed film with an alkaline gas or solution to cause a reaction of the diazonium salt with the phenolic compound in unexposed areas to render the unexposed areas of the film at most only sparingly water-soluble, to form a treated film, said alkaline gas or solution having a sufficient concentration so as to make the unexposed areas of the film sufficiently uniformly at most only sparingly water-soluble so as to dissolve only exposed areas of the film upon development, and wherein this third step further involves a step of contacting a powder with the film to adhere thereto; and (4) a fourth step of developing the treated film with water to remove the film in exposed areas and form a positive-working resist image having a powder pattern, whereby fogging of the powder pattern on the substrate using a positive-working photoresist is avoided.

30. A pattern forming process of claim 29, wherein said water-soluble phenolic compound is at least one member selected from the group consisting of polyhydric phenols, derivatives thereof, and naphthol derivatives.

31. A pattern forming process of claim 29, wherein said water-soluble polymeric compound is at least one member selected from the group consisting of polyvinyl-pyrrolidone, acrylamide-diacetoneacrylamide copolymer, hydroxypropylmethylcellulose, polyacrylamide, polyvinyl alcohol, gelatin, polyethylene oxide, their water-soluble derivatives, and copolymers made of their monomer units.

32. A pattern forming process of any of claims 29–31, wherein the content of said water-soluble phenolic compound ranges from 0.1 to 1.5 moles per mole of said water-soluble aromatic diazonium salt.

33. A pattern forming process of claim 29 or 31, wherein the content of said water-soluble polymeric compound is in the range of 0.5 to 6 in weight ratio to the total content of said water-soluble phenol compound and aromatic diazonium salt.

34. A pattern forming process of claim 29, wherein said step (3) is operated by contacting the film with an alkaline gas.

35. A pattern forming process of claim 34, wherein said alkaline gas is gaseous ammonia.

36. A pattern forming process of claim 34, wherein said alkaline gas is a gaseous organic amine.

37. A pattern forming process of claim 29, wherein said step of contacting a powder with the film is operated before step (4).

38. A pattern forming process of claim 29, wherein said water-soluble phenolic compound is hydroquinone.

39. A process of forming a powder pattern using a positive-working photoresist, which comprises:

(1) a first step of applying a water-soluble positive-working photoresist composition comprising an admixture of water-soluble aromatic diazonium salt, water-soluble phenolic compound, and water-soluble polymeric compound, on a substrate to form a positive-working photoresist film, said composition having sufficient concentration of water-soluble aromatic diazonium salt and phenolic compound, and polymeric compound, such that, upon later contact of the photoresist film with alkaline gas or solution, areas of the film can be rendered at most only sparingly water-soluble;

(2) a second step of exposing said film to a prescribed pattern of actinic ray to decompose the diazonium salt in exposed areas;

(3) a third step of contacting the resultant exposed film with an alkaline gas or solution to cause a reaction of the diazonium salt with the phenolic compound in unexposed areas to render the unexposed areas of the film at most only sparingly water-soluble, to form a treated film, said alkaline gas or solution having a sufficient concentration so as to make the unexposed areas of the film sufficiently uniformly at most only sparingly water-soluble so as to dissolve only exposed areas of the film upon development;

(4) a fourth step of contacting a powder with the treated film to adhere thereto, said fourth step being performed prior to or during developing the treated film; and (5) a fifth step of developing the treated film with water to remove the film in exposed areas and form a positive-working resist image having a powder pattern, whereby fogging of the powder pattern on the substrate using a positive-working photoresist is avoided.

40. A pattern forming process of claim 39, wherein said powder is brought into contact with the film in the state of suspension.

41. A pattern forming process to claim 39, wherein said water-soluble phenolic compound is at least one member selected from the group consisting of polyhydric phenols, derivatives thereof, and naphthol derivatives.

42. A pattern forming process of claim 39, wherein said water-soluble phenolic compound is hydroquinone.

43. A pattern forming process of claim 39, wherein said powder is a black powder, and is brought into contact with the film in the state of a suspension.

44. A pattern forming process of claim 43, wherein said black powder is carbon powder.

* * * * *